(12) United States Patent
Sumino et al.

(10) Patent No.: US 8,630,324 B2
(45) Date of Patent: Jan. 14, 2014

(54) SEMICONDUCTOR LASER DRIVE DEVICE AND IMAGE FORMING APPARATUS INCORPORATING SAME

(75) Inventors: Daijiroh Sumino, Osaka (JP); Hiroaki Kyogoku, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 135 days.

(21) Appl. No.: 13/173,329

(22) Filed: Jun. 30, 2011

(65) Prior Publication Data

US 2012/0027037 A1     Feb. 2, 2012

(30) Foreign Application Priority Data

Jul. 30, 2010   (JP) .................................. 2010-172471

(51) Int. Cl.
*H01S 3/10*     (2006.01)
*B41J 2/435*    (2006.01)

(52) U.S. Cl.
USPC ....................................... 372/38.02; 347/237

(58) Field of Classification Search
USPC ....................................... 372/38.02; 347/237
See application file for complete search history.

(56) References Cited

U.S. PATENT DOCUMENTS

| 6,483,791 | B1 * | 11/2002 | Asada et al. ............... 369/59.11 |
| 7,057,990 | B1 * | 6/2006 | Seo ............................ 369/47.52 |
| 2004/0188717 | A1 | 9/2004 | Ono |
| 2010/0278202 | A1 | 11/2010 | Kamatani |

FOREIGN PATENT DOCUMENTS

| JP | 5-250715 | 9/1993 |
| JP | 5-259545 | 10/1993 |
| JP | 8-139869 | 5/1996 |
| JP | 2000-162527 | 6/2000 |
| JP | 2002-329924 | 11/2002 |
| JP | 2009-164193 | 7/2009 |
| JP | 4471597 | 3/2010 |
| KR | 10-2010-0086075 | 7/2010 |
| WO | WO2009/084467 A1 | 7/2009 |

\* cited by examiner

*Primary Examiner* — Jessica Stultz
*Assistant Examiner* — Marcia Golub-Miller
(74) *Attorney, Agent, or Firm* — Cooper & Dunham LLP

(57) ABSTRACT

A semiconductor laser drive device includes a semiconductor-laser drive element to generate a drive current according to an input control signal to supply the drive current to a semiconductor laser, a control circuit to control the drive current by controlling the semiconductor-laser drive element, and a drive current detection circuit to detect a current value of the drive current supplied to the semiconductor laser and generate a digital control signal representing the detected digital value of the drive current to output.

4 Claims, 8 Drawing Sheets

SEMICONDUCTOR LASER DRIVE DEVICE AND IMAGE FORMING APPARATUS INCORPORATING SAME

TECHNICAL FIELD

The present disclosure relates to a semiconductor laser drive device, and more particularly, to a semiconductor laser drive device capable of detecting degradation of a semiconductor laser with a high degree of accuracy with an uncomplicated configuration.

BACKGROUND ART

Recently, semiconductor laser diodes (hereinafter, referred to as "semiconductor laser") have come to be widely used in a variety of image forming apparatuses using electrophotography, for example, laser printers and digital copiers.

However, the semiconductor laser degrades due to various factors. More specifically, degradation of the semiconductor laser may arise due to crystal defect within several hours. Further, the degradation of the semiconductor laser may arise gradually by being driven at high temperature for a long time.

Further, the degradation of the semiconductor laser may arise due to catastrophic optical damage (COD) or an electrostatic discharge (ESD) during assembly of the laser printers and the digital copiers.

When the semiconductor laser degrades, a larger drive current is required to emit light at a predetermined intensity (quantity of light). When the drive current is increased excessively and power consumption exceeds a rated value, the semiconductor laser may degrade due to heat generated by the power and cause trouble. Further, when a large current beyond the assumed value flows from a semiconductor laser drive device, there is also a possibility of a defect arising due to melting of metal wiring.

JP-2005-32798-A discloses a semiconductor laser drive device that can detect such a degradation of the semiconductor laser. FIGS. 1 and 2 represent a circuit diagram of the semiconductor laser drive device disclosed in JP-2005-32798-A.

In one example, the semiconductor laser drive device shown in FIG. 1 outputs a current Im attenuated from a drive current Iop at a fixed ratio. This output current Im is converted to a voltage Vm. The voltage Vm is compared with a fixed voltage (half of a power-supply voltage) VCC½ by a comparator. When the voltage Vm exceeds the fixed voltage VCC½ (Vm>Vcc/2), a signal Serr indicating abnormality of the value of drive current Iop is output to an image controller provided at a previous stage of the semiconductor laser drive device. Accordingly, the image controller can recognize the abnormality based on the signal Serr indicating the abnormality.

However, when the value of drive current Iop is small and below a predetermined current value, the signal indicating abnormality may not be output in the semiconductor laser drive device shown in FIG. 1.

In another example, a semiconductor laser drive device shown in FIG. 2 outputs the current Im attenuated from the drive current Iop at a fixed ratio. This current Im is converted to the voltage Vm representing the value of the drive current Iop by a current to a voltage conversion circuit R2, and is output to an image controller provided at the previous stage of the semiconductor laser drive device. Accordingly, the image controller can recognize the abnormality based on the voltage Vm representing the value of the drive current Iop.

However, the semiconductor laser drive device shown in FIG. 2 outputs an analog value, making it necessary to mount an analog-to-digital (A/D) converter that converts an analog value to a digital value on the circuit board or have a built-in circuit in the image controller because the image controller cannot perform data processing with the analog value directly.

Accordingly, the number of parts on the circuit board of the image controller increases. Consequently, the configuration of the image controller becomes complicated and the chip area of the image controller expands, resulting in a cost penalty.

SUMMARY

In an aspect of this disclosure, there is a provided a semiconductor laser drive device that includes a semiconductor-laser drive element, a control circuit, and a drive current detection circuit. The semiconductor-laser drive element generates a drive current according to an input control signal to supply the drive current to a semiconductor laser. The control circuit controls the drive current by controlling the semiconductor-laser drive element. The drive current detection circuit detects a current value of the drive current supplied to the semiconductor laser and generates a digital control signal representing the detected digital value of the drive current to output.

In another aspect, there is provided a semiconductor laser drive device that includes a semiconductor-laser drive element, a control circuit, a drive current detection circuit, and a storage circuit. The semiconductor-laser drive element generates a drive current in accordance with an input control signal to supply the drive current to a semiconductor laser. The control circuit controls the supply current by controlling the semiconductor-laser drive element. The drive current detection circuit detects a current value of the drive current supplied to the semiconductor laser and generates a digital control signal representing the detected drive current value to output. The storage circuit stores a digital threshold signal representing an abnormal level of the drive current that is one criterion for detecting degradation of the semiconductor laser. The abnormality detection circuit detects a current value of the drive current supplied to the semiconductor laser to emit light at a predetermined light-emission intensity, and generate and output an abnormality detection signal indicating an abnormal state in which the detected signal corresponding to the digital control signal representing the detected drive current exceeds the digital threshold signal representing the abnormal level.

In another aspect, there is provided a semiconductor laser drive device that includes a drive circuit, a control circuit, an arithmetic and adder circuit, a register, a storage circuit, and an abnormality detection circuit. The drive circuit, including multiple D/A converters, generates a drive current by adding together currents generated by each D/A converter to supply the drive current to the semiconductor laser. The control circuit generates digital control signals to control the currents output from the respective D/A converters and outputs them to the drive circuit. The arithmetic and adder circuit to generate a digital sum signal obtained by setting a digital reference signal chosen from the digital signals, calculating other digital signal based on the standard signal, and adding the calculated other digital signal to the digital reference signal and outputting the digital sum signal. The register temporarily stores a value of the digital sum signal output from the arithmetic and adder circuit. The storage circuit to store a digital threshold signal representing an abnormal level of the drive signal that is one criterion for determining the degradation of the semiconductor laser. The abnormality detection circuit to generate an abnormality detection signal indicating an abnormal state in which the value of the digital sum signal stored in the register exceeds the value of the digital threshold signal stored in the storage circuit.

BRIEF DESCRIPTION OF THE DRAWINGS

A more complete appreciation of aforementioned and other features, aspects, and advantages will be better understood by reference to the following detailed description when considered in connection with the accompanying drawings, wherein.

DETAILED DESCRIPTION OF PREFERRED EMBODIMENTS

Figure 1:
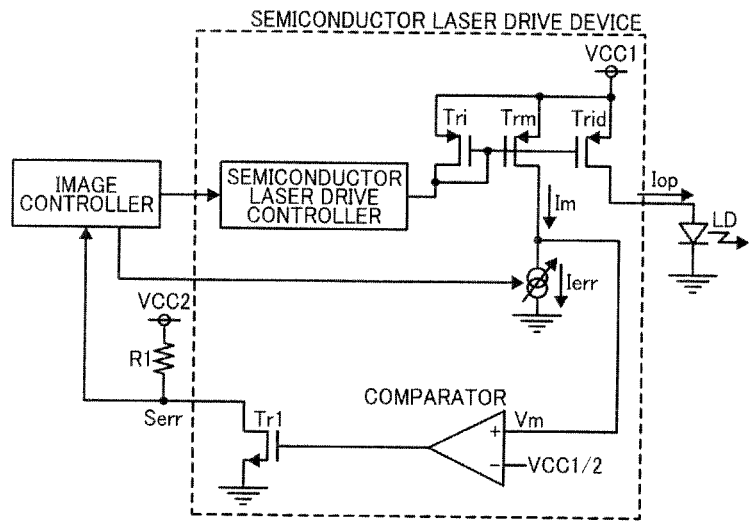
FIG. 1 is a schematic drawing of a known semiconductor laser drive device.
Figure 2:
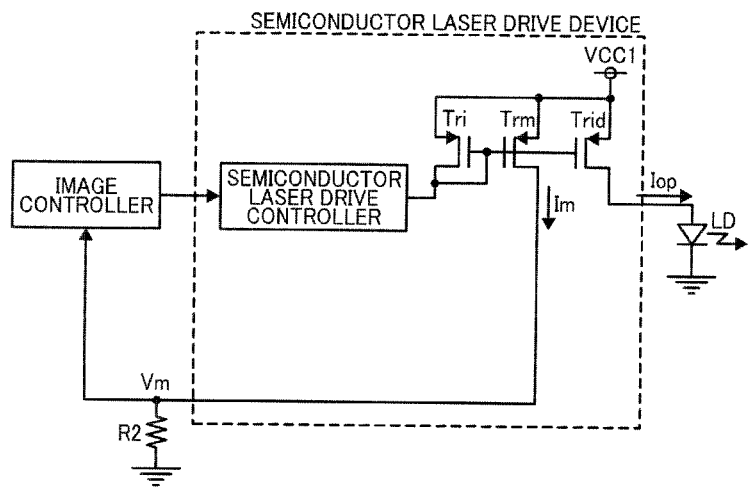
FIG. 2 is a schematic drawing of another known semiconductor laser drive.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, particularly to FIGS. 3, 5, 7 and 9, semiconductor laser drive devices according to illustrative embodiments are described.

Figure 3:
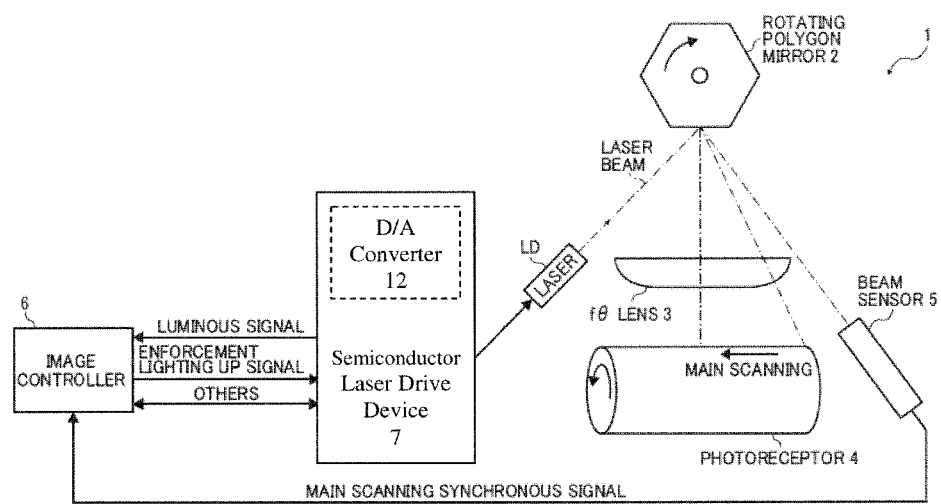
FIG. 3 is a schematic drawing of an image forming apparatus using a semiconductor laser drive device according to embodiments.

FIG. 3 is a schematic drawing of a configuration of an image forming apparatus 1 that employs a semiconductor laser drive device 7 according to the illustrative embodiments. This image forming apparatus 1 is used for image forming apparatuses using the electrophotography, for example, laser printers, and digital copiers.

The image forming apparatus 1 includes the semiconductor laser LD, a polygon mirror 2, a scanning lens 3, a photoreceptor 4, a beam sensor 5, an image controller 6, and the laser drive device 7.

In the image forming apparatus 1 of FIG. 3, the semiconductor laser diode LD (hereinafter "semiconductor laser LD") functioning as a light source emits a laser light, and the laser light is scanned (deflected) by the polygon mirror 2 that rotates at a constant high velocity. Then, the laser light concentrates and forms a beam spot on the photoreceptor 4 (scanned medium) via the scanning lens 3 (f θ lens). As the laser light thus deflected by the polygon mirror 2 scans and exposes the photoreceptor 4 in a main scanning direction and in a sub-scanning direction orthogonal to the main scanning direction and in which the photoreceptor 4 rotates, image signals are recorded with respect to each line thereof. The semiconductor laser LD repeatedly scans the image data on the photoreceptor 4 in the main scanning direction in a predetermined cycle at a rotation velocity and a recording density, thus forming a latent image on a surface of the photoreceptor 4.

The beam sensor 5 is disposed in a position at which the laser beam is radiated, that is, a position close to the one end of the photoreceptor 4, to generate a main scanning synchronized signal. The image controller 6 outputs a control signal to control the quantity of light of the semiconductor laser LD necessary to form the image to the semiconductor laser drive device 7 that controls driving of the semiconductor laser LD. In addition, the image controller 6 further generates control signals including a signal to control a recording timing to record the image in the main scanning direction based on the main scanning synchronized signal, a signal to input and output the image signal based on the main scanning synchronized signal.

There is a forced lighting-up period caused by a forced lighting-up signal that makes the semiconductor laser LD to light up for a certain fixed period continuously with every one line at the non-image region before the image is recorded.

It becomes possible to correct the quantity of light on every one line or more than one lines by performing APC (Automatic Power Control) during the forced lighting-up period caused by the forced lighting-up signal. As a result, even when the ambient temperature is increased and the operation current is increased, it is possible to accurately control the quantity of light of the semiconductor laser LD when the semiconductor laser LD is turned on. The forced lighting-up signal, a light-emitting signal, and an APC execution signal, etc. are input from the image controller 6 to the semiconductor laser drive device 7.

Figure 4:
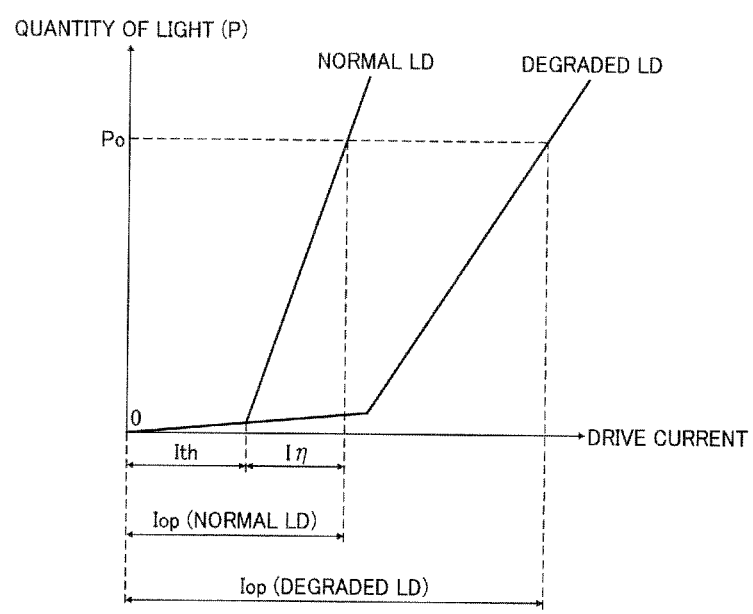
FIG. 4 is a graph representing a characteristic of quantity of light vs. drive current of the semiconductor laser.

FIG. 4 is a graph representing a relation between a drive current of the semiconductor laser LD and the quantity of light by comparing a case of a normal laser and that of a degraded laser.

As it is understood from FIG. 4, when the semiconductor laser LD degrades, a threshold current Ith indicating a current point at which the quantity of light P of the semiconductor laser LD begins to be increased suddenly is increased. Further, a characteristic of the quantity of light corresponding to a light-emitting current Iη after the semiconductor laser LD begins to emit is decreased. More specifically, differential calculus coefficient η (mW/mA), which indicates a slope of the line of the quantity of light (mW) vs. light-emitting current Iη (mA), obtained by dividing a predetermined quantity of light Po by the light-emitting current Iη, deteriorates. Accordingly, the light-emitting current Iη to obtain a desired quantity of light is increased.

Since the drive current Iop is sum of the threshold current Ith and the light-emitting current Iη, the driving current Iop necessary to obtain a desired quantity of light Po is increased when the semiconductor laser LD degrades.

Figure 5:
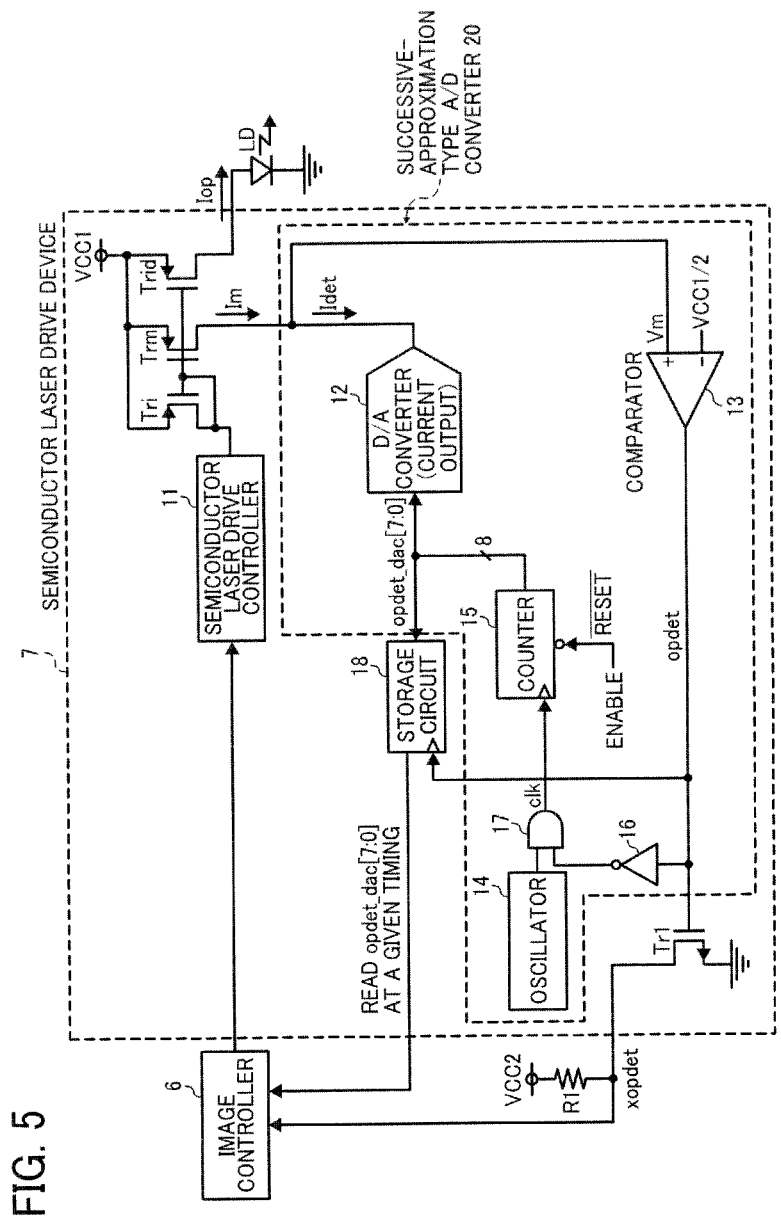
FIG. 5 is a circuit diagram of a semiconductor laser drive device according to a first embodiment.

FIG. 5 is a circuit diagram of the semiconductor laser drive device 7 according to a first embodiment. In FIG. 5, the semiconductor laser drive device 7 includes PMOS transistors Tri, Trm, and Trld, a semiconductor-laser drive controller 11, a digital to analog converter (hereinafter "D/A converter") 12, a comparator 13, and an NMOS transistor Tr1. The PMOS transistors Tri, Trm, and Trld constitute a current mirror circuit. The semiconductor-laser drive controller 11 controls gate voltages of the PMOS transistors Tri, Trm, and Trld in accordance with the control signal input from the image controller 6. The D/A converter 12 is a current output type converter that generates a detection current Idet having a current value according to 8 bit current control signal opdet_dac [7:0] and outputs the detection current Idet.

Further, the semiconductor laser drive device 7 includes an oscillator 14, a counter 15, an inverter 16, an AND circuit 17, and a storage circuit 18. The oscillator 14 generates a clock signal clk, the counter 15 increases and decreases the 8 bit current control signal opdet_dac [7:0], the inverter 16 is a stop means to stop the clock signal clk, and the storage circuit 18 stores the value of the 8 bit current control signal opdet_dac [7:0] at a predetermined timing.

The PMOS transistor Trld functions as a semiconductor-laser drive element to generate a drive current Iop according to the input control signal for supply to the semiconductor laser LD. The semiconductor-laser drive controller 11 and the PMOS transistor Tri function as a control circuit that controls a current (drive current Iop) to supply the semiconductor laser LD by controlling the semiconductor-laser drive element. In FIG. 5, a circuit block surrounded by a broken line that includes the oscillator 14, the counter 15, the inverter 16, the AND circuit 17, the comparator 13, and the D/A converter 12 forms a successive approximation-type A/D converter 20, which receives a monitor voltage Vm and outputs the current control signal opdet_dac[7:0].

The successive-approximation type A/D converter 20 and the PMOS transistor Trm function as a drive current detection circuit, which detects a current value of the drive current Iop supplied to the semiconductor laser LD and generates a digital control signal, that is, the current control signal opdet_dac [7:0], representing the detected value of the drive current Iop, and outputs it. The drive current detection circuit is not limited to the circuit surrounded by the broken line shown in FIG. 5 and the PMOS transistor Trld. However, any circuit that functions similarly to the circuit described above can be used. In the drive-current detection circuit, the PMOS transistor Trm functions as a proportional current generator, the D/A converter 12 functions as a D/A conversion circuit, and the counter 15 functions as a counter circuit.

The PMOS transistor Trld, the PMOS transistor Tri, the semiconductor-laser drive controller 11, the PMOS transistor Trm, the successive-approximation type A/D converter 20, and the storage circuit 18 may be integrated on a single integrated circuit (IC).

In this configuration, it is now defined that a size of the transistor of the PMOS transistor Trld is "Wld", a size of the transistor of the PMOS transistor Trm is "Wm", a current supplied to the semiconductor laser LD is the drive current Iop, a current flowing through the PMOS transistor Trm is a monitor current Im.

When the current mirror circuit constituted by the PMOS transistors Tri, Trm, and Trld generates currents according to each ratio of the transistor size of the PMOS transistors Tri, Trm, and Trld, respectively, the monitor current Im is expressed as $$Im = Iop \times (Wm/Wld)$$

since Wld:Wm=Iop:Im.

Consequently, the PMOS transistor Trm outputs the monitor current Im that is proportional to the drive current Iop supplied from the drain of the PMOS transistor Trld to the semiconductor laser LD through the drain of the PMOS transistor Trm.

A detection current Idet output from the D/A converter 12 that is a load of the PMOS transistor Trm is increased when the current control signal opdet_dac [7:0] input to the D/A converter 12 is increased and is decreased when the current control signal opdet_dac [7:0] is decreased. When an enable signal input to the counter 15 is a low level, the current control signal opdet_dac [7:0] output from the counter 15 is reset and becomes the maximum value 255d=FFh. More specifically, when the enable signal is a low level, the current value of the current Idet output from the D/A converter 12 becomes the largest current value that the D/A converter 12 can output. When the enable signal input to the counter 15 is changed to a high level from a low level so that the reset state of the counter 15 is released, the current control signal opdet_dac [7:0] output from the counter 15 is decreased from the maximum value like, FFh, FEh, FDh, FCh, . . . 02 h, 01 h, 00 h in accordance with the clock signal clk.

When the detection current Idet becomes lower than the monitor current Im (Idet<Im(Im=Iop×(Wm/Wld)), a monitor voltage Vm that is a drain voltage of the PMOS transistor Trm follows the relation "the monitor voltage Vm is greater than half of a power-supply voltage VCC½ (Vm>VCC½)". Accordingly, a drive-current detection signal opdet output from the comparator 13 becomes high so that NMOS transistor Tr1 is switched on.

Further, an inverted drive-current detection signal xopdet that is an inverted signal of the drive-current detection signal opdet becomes low and the low level inverted drive-current detection signal xopdet is output to the image controller 6. In addition, when the drive-current detection signal opdet becomes high, the clock signal clk becomes low through the inverter 16 and the AND circuit 17, and the clock signal clk is stopped.

Accordingly, a value of the current control signal opdet_dac [7:0] at a time when the detection current Idet falls below the monitor current Im (Idet<Im) is held, and the value is output to the storage circuit 18. The storage circuit 18 stores the value of the current control signal opdet_dac [7:0] every time the drive-current detection signal opdet becomes high from low. The value of the current control signal opdet_dac [7:0] represents an abnormal level of the drive current Iop that is one criterion for determining the degradation of the semiconductor laser LD as the digital value.

The storage circuit 18 is formed by register circuits that can read the current control signal opdet_dac [7:0] stored in the storage circuit 18 at a given timing by inputting an external signal.

The bit count of the D/A converter is 8 in this embodiment, however, the bit count may be increased or decreased depending on the current value of the drive current Iop supplied to the semiconductor laser LD and the requested detection accuracy of the current value of the drive current Iop. More specifically, the bit count of D/A converter 12 is increased when the current value of drive current Iop is larger and the requested detection accuracy of the current value of the driving current Iop is higher.

Figure 6:
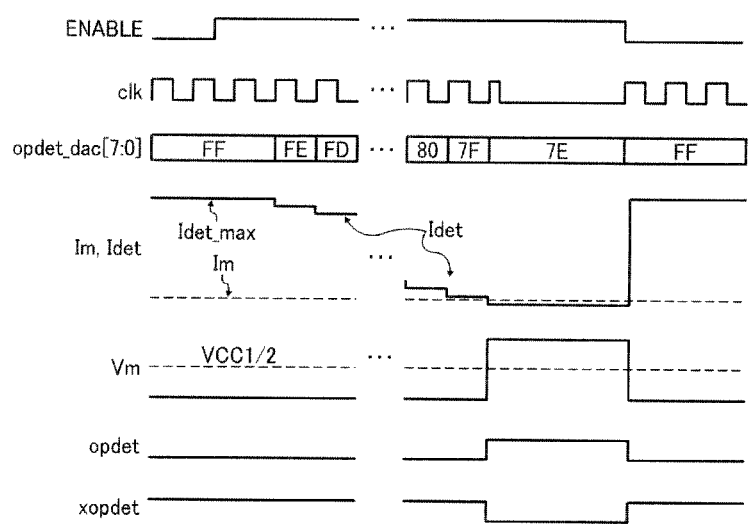
FIG. 6 is a timing chart representing operation of the semiconductor laser drive device according to the first embodiment.

FIG. 6 is the timing chart representing an example of signals at each part of semiconductor laser drive device 7 of FIG. 5.

First, when the enable signal is a low level, the counter 15 is set in a reset state, the current control signal opdet_dac [7:0] is set to the maximum value FFh, and the current value of the detection current Idet becomes the maximum current value Idet_max that is the largest current value that the D/A converter 12 can output. Accordingly, the detection current Idet is larger than the monitor current Im (Idet>Im).

Under the condition at which the detection current Idet is larger than the monitor current Im (Idet>Im), the monitor voltage Vm is smaller than the half of the power-supply voltage (=Vcc½) (Vm<Vcc½). Accordingly, the drive-current detection signal opdet is set at a low level so that the NMOS transistor Tr1 is switched off and the inverted drive-current detection signal xopdet becomes high. The high level inverted drive-current detection signal xopdet is output to the image controller 6.

Next, when the enable signal becomes high, the counter 15 is released from the reset state, and the current control signal opdet_dac [7:0] begins to be gradually decreased from the maximum value FFh in accordance with the clock signal clk, like, FFh, FDh, . . . . As the value of the current control signal opdet_dac [7:0] is decreased, the detection current Idet output from the D/A converter 12 is decreased. Then, when the value of the current control signal opdet_dac [7:0] is decreased to a predetermined value, the detection current Idet falls below the monitor current Im. In the embodiment of FIG. 6, when the current control signal opdet_dac [7:0] is 7Eh, the relation "the detection current Idet is smaller than the monitor current (Idet<Im)" is established.

In a state in which the detection current Idet is smaller than the monitor current Im (Idet<Im), the monitor voltage Vm becomes greater than the half of the power-supply voltage (Vm>Vcc½). Therefore, the comparator 13 causes the drive-current detection signal opdet to become high so that the NMOS transistor Tr1 is switched on. Then, the inverted drive-current detection signal xopdet becomes low and the low level inverted drive-current detection signal xopdet is output to the image controller 6. When the drive-current detection signal opdet becomes high, the clock signal clk becomes low and is stopped. Accordingly, the counter 15 holds a value "7Eh" of the current control signal opdet_dac [7:0] at a time when the detection current Idet falls below the monitor current Im (Idet<Im) and outputs the value "7Eh" to the storage circuit 18. At the same time, the storage circuit 18 stores the value of the current control signal opdet_dac [7:0]=7Eh from the counter 15 when the drive-current detection signal opdet becomes high.

Finally, when the enable signal becomes low, the counter 15 is reset, each signal in FIG. 6 returns to the initial state. Then, the clock signal clk that has been stopped starts to operate again so that the semiconductor laser drive device 7 prepares for the next current detection of the drive current Iop. However, the value 7Eh of the current control signal opdet_dac [7:0] stored in the storage circuit 18 is held until the next detection operation of the drive current Iop is performed.

Thus, the low level inverted drive-current detection signal xopdet is output to the image controller 6 as a signal indicating a detection of the drive current Iop. The detected value of the drive current Iop is stored in the storage circuit 18 as the current control signal opdet_dac [7:0]. When the image controller 6 recognizes the detection of the drive current Iop by the change of the inverted drive-current detection signal xopdet from a high level to a low level, the image controller 6 easily gets the current value of the drive current Iop as a digital value by reading the current control signal opdet_dac [7:0] stored in the storage circuit 18 at a given timing by inputting an external signal.

In general, the amount of the drive current Iop to supply the semiconductor laser LD necessary to obtain a desired quantity of light is increased when the semiconductor laser LD is degraded, for example, the degradation arising due to abruptly crystal defect that is an intrinsic problem of the semiconductor laser LD, the degradation caused by gradually being driven under a high temperature condition for a long time, and particularly, caused by optical damages and an electrostatic discharges as a result of certain external circumstances during assembly process of the laser printers and the digital copiers.

In this configuration, even when the semiconductor laser LD degrades due to above-described factors, it is possible to determine the degradation of the semiconductor laser LD easily by detecting the increase of the drive current Iop necessary to obtain a desired quantity of light.

As described above, the semiconductor laser drive device 7 according to the first embodiment includes the A/D conversion unit that converts the current value (analog value) to the digital value. Accordingly, the image controller 6 does not need to include an A/D conversion unit. Consequently, it becomes possible to detect the degradation of the semiconductor laser LD without complication, expansion and cost increase of the image controller 6.

The signal representing the detected value of the drive current Iop, that is, the current control signal opdet_dac [7:0] is generated as the digital value, and is output. Accordingly, using this digital value of the drive current Iop, the degradation of the semiconductor laser LD can be detected with a high degree of accuracy in the image controller 6.

Thus, the semiconductor laser drive device 7 according to the first embodiment can perform the degradation detection of the semiconductor laser LD with a high degree of accuracy, and it is also possible to avoid complication, expansion and cost increase of the image controller 6.

In the semiconductor laser drive device 7 according to the first embodiment, the voltage representing the current value of the drive current Iop is generated to read as the digital signal and is output so that the image controller 6 provided separately can determine the degradation of the semiconductor laser LD. However, the semiconductor laser drive device 7 may include a degradation detector (abnormal detection circuit). Such a semiconductor laser drive device is described as a second embodiment.

(Second Embodiment)

A semiconductor laser drive device 7b according to an illustrative second embodiment is described below with reference to FIGS. 7 through 8B.

Figure 7:
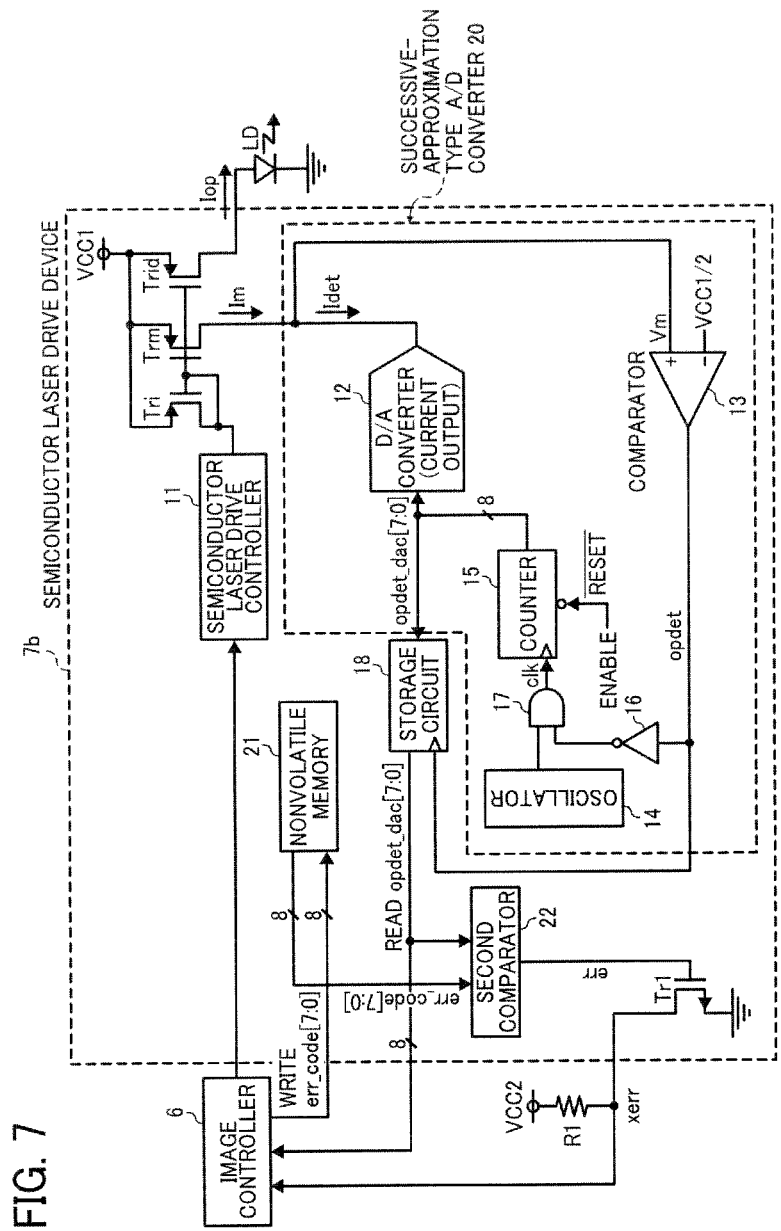
FIG. 7 is a circuit diagram of a semiconductor laser drive device according to a second embodiment.

FIG. 7 is a circuit diagram of the semiconductor laser drive device 7b according to the second embodiment. It is the difference between the semiconductor laser drive device of FIG. 7 and that of FIG. 5 that the semiconductor laser drive device 7b includes a nonvolatile memory 21 and a second comparator 22. The nonvolatile memory 21 stores a threshold signal err_code[7:0] representing an abnormal level of the drive current Iop that is one criterion for determining the degradation of the semiconductor laser LD as a digital value. The second comparator 22 compares the value of the signal opdet_dac[7:0] representing the detected drive current Iop with the value of the threshold signal err_code[7:0] representing the abnormal level of the drive current Iop. Similarly to the first embodiment, a current control signal opdet_dac [7:0] representing the detected drive current Iop is obtained by detecting the drive current Iop supplied to the semiconductor laser LD to emit light at a predetermined light-emission intensity The PMOS transistor Trld functions as a semiconductor-laser drive element that generates a drive current Iop in accordance with the input control signal for supply to the semiconductor laser LD. The semiconductor-laser drive controller 11 and the PMOS transistor Tri function as a control circuit that controls a current to supply to the semiconductor laser by controlling the semiconductor-laser drive element.

In FIG. 5, a circuit block that is surrounded by a broken line and includes the oscillator 14, a counter 15, an inverter 16, an AND circuit 17, a comparator 13 and a D/A converter 12 forms a successive-approximation type A/D converter 20 that receives the monitor voltage Vm and outputs the current control signal opdet_dac[7:0].

The successive-approximation type A/D converter 20 and the PMOS transistor Trm function as a drive current detection circuit that detects the current value of the drive current Iop supplied to the semiconductor laser, and generates a digital control signal, that is, the current control signal opdet_dac[7:0] representing the detected current value and outputs it. The drive current detection circuit is not limited to the circuit surrounded by the broken line shown in FIG. 5. However, any circuit that functions similarly to the circuit described above can be used.

The storage circuit 18 stores the value of the current control signal opdet_dac [7:0] representing the abnormal level of the drive current Iop that is the criterion for determining the degradation of the semiconductor laser LD as the digital value. The second comparator 22 and the NMOS transistor Tr1 function as an abnormality detection circuit (degradation detector) that detects a current value of the drive current Iop supplied to the semiconductor laser LD to emit light at a predetermined intensity and generates an abnormality detection signal err indicating the abnormal state for output when the value of the current control signal opdet_dac [7:0] as the detected current value exceeds the threshold signal err_code [7:0] representing the abnormal level of the drive current Iop. In the drive current detection circuit, the PMOS transistor Trm functions as a proportional current generator, the D/A converter 12 functions as a D/A conversion circuit, and the counter 15 functions as a counter circuit.

The PMOS transistor Trld, the PMOS transistor Trm, the semiconductor-laser drive controller 11, the PMOS transistor Tri, the successive-approximation type A/D converter 20, the storage circuit 18, the second comparator 22, and the NMOS transistor Tr1 may be integrated on a single IC.

In this circuit configuration, when the current control signal opdet_dac[7:0] representing the detected value of the drive current Iop exceeds the value of the threshold signal err_code[7:0] representing the abnormal level of the drive current Iop, the abnormality detection signal err indicating the abnormal state becomes high so that the NMOS transistor Tr1 is turned on. Further, an inverted abnormality detection signal xerr becomes low and the low level inverted abnormality detection signal xerr is output to the image controller 6.

The threshold signal err_code[7:0] representing the abnormal level of the drive current Iop is set based on the value of the current control signal opdet_dac[7:0] representing the detected value of the drive current Iop obtained by detecting the drive current Iop when the semiconductor laser LD normally emits light at the predetermined light-emission intensity before degradation.

The timing chart for detecting the current value of the drive current Iop is the same as the timing chart of FIG. 6. Accordingly, the description and drawing are omitted.

Figure 8A:
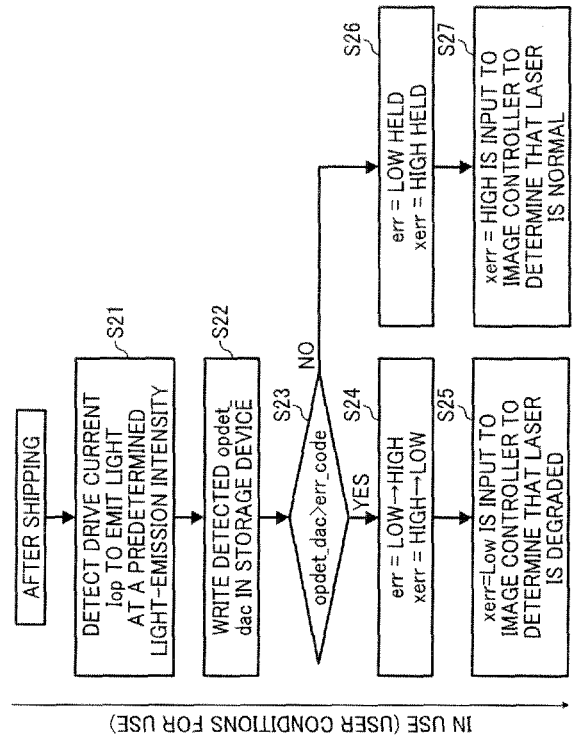
FIGS. 8A and 8B are flow charts illustrating steps in a process of determining the degradation of the semiconductor laser using the semiconductor laser drive device according to the second embodiment.
Figure 8B:
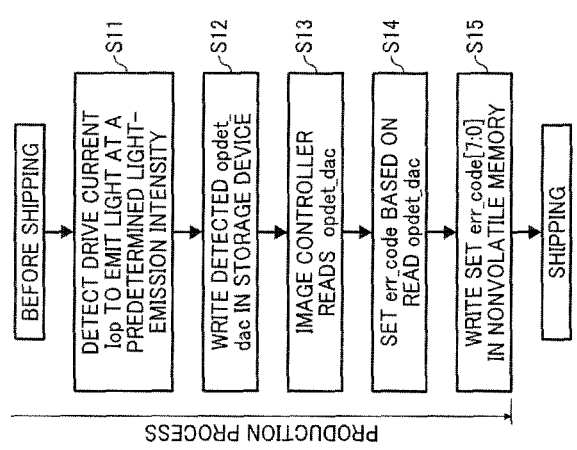

FIGS. 8A and 8B are flow charts illustrating steps in a process of determining the degradation of the semiconductor laser using the semiconductor laser drive device 7b according to the second embodiment. Referring to FIG. 8A, the process to write the threshold signal err_code [7:0] representing the abnormal level of the drive current Iop in the nonvolatile memory 21 embedded in the semiconductor laser drive device 7b in the assembly process of the laser printers and digital copiers etc. before shipping is described.

First, the drive current Iop supplied to the semiconductor laser LD to emit light at the predetermined light-emission intensity is detected (S11). The current control signal opdet_dac[7:0] representing the detected value of the drive current Iop is written in the storage device 18 (S12). More specifically, the written current control signal opdet_dac[7:0] represents the value of the drive current Iop with the normal laser.

Subsequently, the image controller 6 reads the current control signal opdet_dac[7:0] stored in the storage device 18 (S13). The value of the threshold signal err_code[7:0] representing the abnormal level of the drive current Iop is set based on the read current control signal opdet_dac[7:0] by a user (S14).

For example, if it is requested to determine the degradation of the semiconductor laser LD when the current value of the drive current Iop is decreased below 50% of that of the normal laser, the value of the threshold signal err_code[7:0] representing the abnormal level of the drive current Iop may be set as 1.5 times of the value of the current control signal opdet_dac [7:0] read from the storage circuit 18 representing the value of the drive current Iop. The set value of the threshold signal err_code[7:0] is written in the nonvolatile memory 21 before shipping (S15).

Referring to FIG. 8B, a flow of the procedure to determine the degradation of the semiconductor laser LD under the user conditions for use after shipment is described.

In the semiconductor laser drive device 7b, the drive current Iop supplied to the semiconductor laser LD to emit light at the predetermined light-emission intensity is detected as the current control signal opdet_dac[7:0] by the successive-approximation type A/D converter 20 and the PMOS transistor Trm(S21). The current control signal opdet_dac[7:0] representing the detected value of the drive current Iop is written in the storage device 18 (S22).

The second comparator 22 determines whether or not the current control signal opdet_dac[7:0] representing the detected value of the drive current Iop is larger than the value of the threshold signal err_code[7:0] representing the abnormal level of the drive current Iop (S23). When the current control signal opdet_dac[7:0] representing the detected value of the drive current Iop is larger than the value of the threshold signal err_code[7:0] representing the abnormal level of the drive current Iop, an abnormality detection signal err is becomes high and an inverted abnormality detection signal xerr becomes low (S24). The low level inverted abnormality detection signal xerr is output to the image controller 6 that so that it is determined that the semiconductor laser LD is degraded (S25).

By contrast, at S23, when the current control signal opdet_dac[7:0] representing the detected value of the drive current Iop is smaller than the value of the threshold signal err_code [7:0] representing the abnormal level of the drive current Iop, the abnormality detection signal err is set to a low level and the inverted abnormality detection signal xerr is kept at a high level (S26). The high level inverted abnormality detection signal xerr is output to the image controller 6 so that it is determined that the semiconductor laser LD is normal (S27).

In the second embodiment, the abnormal level of the drive current Iop that is set based on the value of the drive current Iop when the drive current Iop is supplied to the semiconductor laser LD normally to emit light at the predetermined light-emission intensity is written in the nonvolatile memory 21 during the production process in advance. Then, when the detected value of the drive current Iop exceeds the signal value representing the abnormal level of the drive current Iop, the abnormality detection signal err is output. Accordingly, the current value with the normal laser and the current value with the degraded laser can be compared relatively so that the laser degradation detection can be performed with a high degree of accuracy.

As described above, since the semiconductor laser drive device 7b according to the second embodiment includes the A/D conversion unit that converts the current value (analog value) of the drive current Iop to the digital value therein. Accordingly, it is not necessary to include the A/D conversion unit in the image controller 6. Consequently, it is possible to avoid complication, expansion, and cost increase of the image controller 6. Further, using the semiconductor laser drive device 7b according to the second embodiment, it becomes possible to generate the abnormality detection signal err indicating the abnormal state and output to the image controller 6 when the signal value representing the detected current value exceeds the signal value representing the abnormal level of the drive current Iop. Accordingly, it is not necessary to judge the abnormality in the side of the image controller 6. Consequently, it becomes possible to avoid complication, expansion and cost increase of the image controller 6 more reliably.

Further, the signal representing the detected value of the drive current Iop is generated as the digital value, and is output. Accordingly, using this digital value of the drive current Iop, the degradation detection of the semiconductor laser LD can be performed with a high degree of accuracy in the image controller 6.

Further, the semiconductor laser drive device 7b according to the second embodiment includes the storage circuit 18 and the second comparator 22 (abnormality detection circuit). The storage circuit 18 stores the digital value of the signal representing the abnormal level of the drive current Iop that is the criterion for determining the degradation of the semiconductor laser LD. The second comparator 22 compares the current value obtained by detecting the drive current Iop supplied to the semiconductor laser LD to emit light at the predetermined light-emission intensity with the signal value representing the abnormal level of the drive current Iop, and outputs the abnormality detection signal indicating the abnormal state to the image controller 6 when the signal value representing the detected value of the drive current Iop exceeds the signal representing the abnormal level of the drive current Iop. Accordingly, the current value with the normal laser and the current at the degraded laser can be compared relatively, so that the laser degradation detection can be performed with a higher degree of accuracy.

Thus, the semiconductor laser drive device 7b according to the second embodiment can perform the degradation detection of the semiconductor laser with a high degree of accuracy, and it is also possible to avoid complication, expansion and cost increase of the image controller 6.

In the first and second embodiments, the current value of the drive current Iop supplied to the semiconductor laser LD is detected by the successive-approximation type A/D converter and the value of the drive current Iop is measured by outputting the control code of the successive-approximation type A/D converter.

However, in the semiconductor laser drive device that includes more than one D/A converters, all the currents generated by each D/A converter may be added to supply it to the semiconductor laser LD. In such a semiconductor laser drive device, it is sufficient to calculate and add the control code of each D/A converter to obtain the desired function to output. Such a semiconductor laser drive device is proposed as a third embodiment.

(Third Embodiment)

A semiconductor laser drive device 7c according to an illustrative third embodiment is described with reference to FIG. 9.

Figure 9:
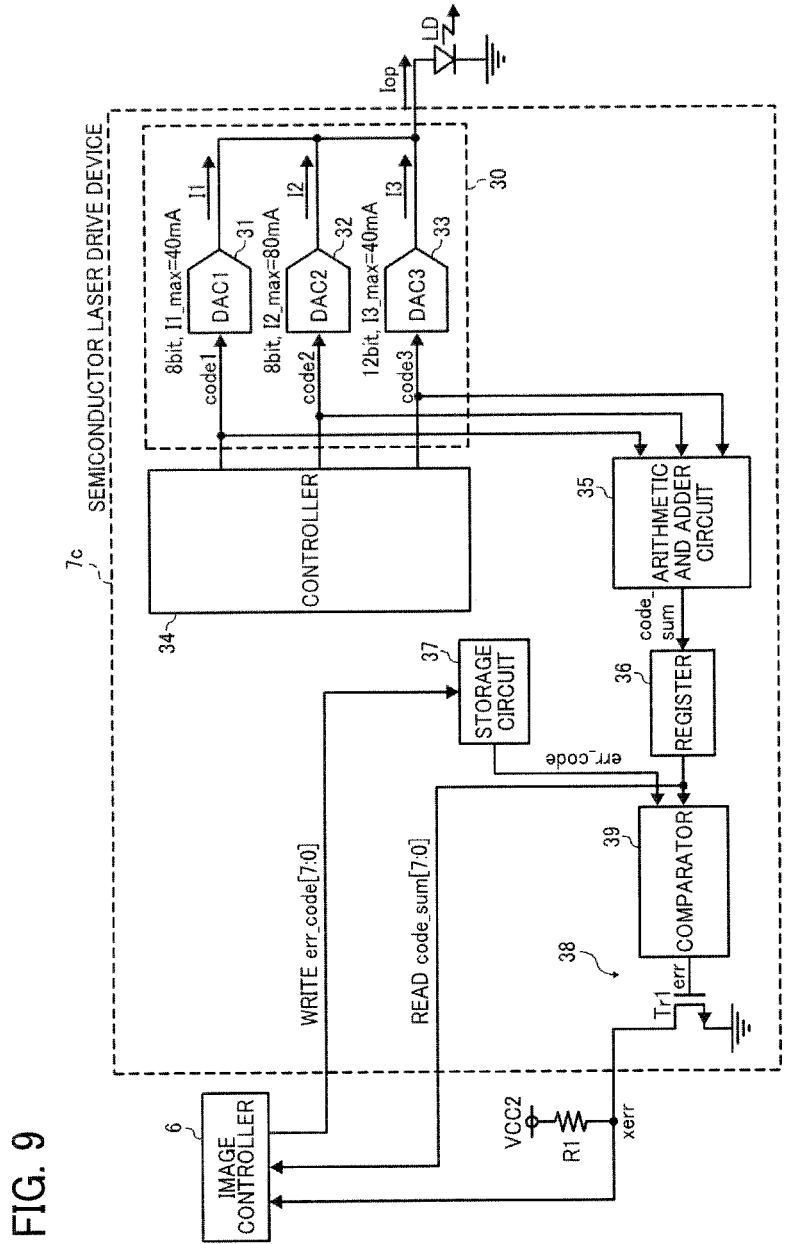
FIG. 9 is a circuit diagram of a semiconductor laser drive device according to a third embodiment.

FIG. 9 is a circuit diagram of the semiconductor laser drive device 7c according to the third embodiment. In the embodiment shown in FIG. 9, the semiconductor laser drive device 7c includes a drive circuit 30 that includes three D/A converters including a first DAC 31, a second DAC 32, and a third DAC 33, and a controller 34. The drive circuit 30 supplies a drive current Iop to the semiconductor laser LD by adding currents I1, I2, and I3 output from the D/A converters DAC 31, DAC 32, and DAC 33, respectively. The controller 34 generates digital signals code1, code2, and code3 to control the currents I1, I2, and I3, respectively and outputs them to the drive circuit 30.

Further, the semiconductor laser drive device 7c includes an arithmetic-adder circuit 35 and a register 36. The arithmetic-adder circuit 35 sets a digital reference signal code1 chosen from the digital signals code1, code2, and code3, calculates other digital signals code2 and code3 based on the standard signal code1, adds the calculated other digital signals code2 and code3 to the digital reference signal code1, and outputs a digital sum signal, thus generating the digital sum signal code_sum. The register 36 temporarily stores the value of the digital signal code_sum output from the arithmetic-adder circuit 35.

Further, the semiconductor laser drive device 7c includes a storage circuit 37 and an abnormality detection circuit 38. The storage circuit 37 stores a threshold signal err_code representing an abnormal level of the drive current Iop that is one criterion for determining the degradation of the semiconductor laser LD as a digital signal value. The abnormality detection circuit 38 generates an abnormality detection signal err indicating an abnormal state when the value of the digital signal code_sum stored in the register 36 exceeds the value of a digital signal err_sum stored in the storage circuit 37.

Further, the abnormality detection circuit 38 includes a comparator 39 and the NMOS transistor Tr1. The comparator 39 compares the digital signal code_sum with the digital threshold signal err_code. The storage circuit 37 is formed of nonvolatile memory devices.

The first, second, and third D/A converters 31, 32, and 33 function as DA converters. The drive circuit 30 adds the currents generated by each D/A converter for supply to the semiconductor laser LD to as a drive current Iop. The control circuit 34 is formed of more than one D/A converters and forms a controller that controls the amount of the currents generated by each DA converter in the drive circuit 13.

The arithmetic-adder circuit 35 sets a digital reference signal code1 chosen from the digital signals, calculates other digital signals based on the standard signal code1, adds the calculated other digital signals to the digital reference signal, and outputs the digital sum signal, thus generating the digital sum signal.

The register 36 functions as a register circuit that temporarily stores the digital sum signal code_sum as the digital signal value output from the arithmetic-adder circuit 35. The storage circuit 37 stores the digital threshold signal err_code representing abnormal level of the drive signal as a digital signal that is the criterion for determining the degradation of the semiconductor laser LD. The abnormality detection circuit 38 generates an abnormality detection signal error indicating an abnormal state in which the digital value of the digital sum signal code_sum stored in the register circuit exceeds the digital value of the digital threshold signal err_code stored in the storage circuit 37.

The drive circuit 30, the control circuit 34, the arithmetic-adder circuit 35, the register 36, storage circuit 37, and the abnormality detection circuit 38 may be integrated on a single IC.

In this embodiment, it is defined that the maximum output current of the first DAC 31 is I1_max=40 mA at the resolution of 8 bit and code1=255, the maximum output current of the second DAC 32 is I2_max=80 mA at the resolution of 8 bit and code2=255, and the maximum output current of the third DAC 33 is I3_max=40 mA at the resolution of 12 bit and code3=4095. In this case, the output currents of the first DAC 31, the second DAC 32, and the third DAC 33 are expressed as $$I1=code1 \times I1\_max/255,$$

$$I2=code2 \times I2\_max/255, \text{ and}$$

$$I3=code3 \times I3\_max/4095, \text{ respectively.}$$

Since the current value of the drive current Iop is the sum of current values of the currents I1, I2, and I3, the drive current Iop is expressed as $$Iop=(code1+2 \times code2+code3 \times 255/4095) \times 40 \text{ mA}/255$$

when code1 is the base.
Similarly, $$Iop=(code1/2+code2+code3 \times 255/8190) \times 80 \text{ mA}/255$$

when code2 is the base, and $$Iop=(code1 \times 4095/255+code2 \times 8190/255+code3) \times 40 \text{ mA}/4095$$

when code3 is the base.

When code1 is the base, it is possible to obtain the current value of the drive current Iop if the digital signal code_sum=(code1+2×code2+code3×255/4095) is calculated. The drive current Iop has a proportionate relationship to the digital sum signal code_sum. Accordingly, when the digital sum signal the code_sum is changed by +50%, the drive current Iop changes by +50%. Accordingly, if variable ratio of the digital sum signal code_sum is known, it is possible to know the variable ratio of the drive current Iop.

The calculation of the equation, code_sum=(code1+2×code2+code 3×255/4095), is performed by the arithmetic-adder circuit 35.

In this embodiment, the drive circuit includes three D/A converters, the first DAC 31, the second DAC 32, and the third DAC 33 to explain simply, however, the drive circuit may include more than three DAC converters.

Referring to FIG. 9, a procedure to determine the degradation of the semiconductor laser LD is explained.

Before the semiconductor laser LD degrades, the digital sum signal code_sum is calculated at a predetermined light-emission intensity and is written in the register 36. The digital sum signal code_sum written in the register 36 is read by the image controller 6. Based on the read digital sum signal code_sum, the threshold signal err_code representing the abnormal level of the drive current Iop that is the criterion for determining the degradation of the semiconductor laser LD is set by the user. For example, if it is desired to determine the degradation of the semiconductor laser LD when the current value of the drive current Iop is decreased below 50% of that of the normal laser, the value of the threshold signal err_code may be set as 1.5 times of the value of the digital sum signal code_sum read from the register 36. Then, the set value of the threshold signal err_code is written in the storage circuit 37 (nonvolatile memory) during the production process before shipping.

Under the user conditions for use after shipment, when the digital sum signal code_sum written in the register 36 at a given timing at the predetermined light-emission intensity exceeds the value of the threshold signal err_code, the abnormality detection signal err becomes high, and the NMOS transistor Tr1 is switched on so that the abnormality detection signal err becomes low. The low level inverted abnormity detection signal xerr is output to the image controller 6. As a result, it is determined that the semiconductor laser LD is degraded.

By contrast, when the digital sum signal code_sum written in the register 36 at a given timing at the predetermined light-emission intensity is smaller than the value of the threshold signal err_code, the abnormality detection signal err is a low level, and the NMOS transistor Tr1 is switched off so that the inverted abnormality detection signal xerr is kept at high level. The high level inverted detection signal xerr is output to the image controller 6. As a result, it is determined that the semiconductor laser LD is normal.

In the above-described circuit of the semiconductor laser drive device 7c, it becomes possible to obtain the drive current of the semiconductor laser LD precisely with a high degree of accuracy by carrying out an arithmetic and adder operation.

Further, the semiconductor laser drive device 7c includes the register 36, the storage circuit 37, and the abnormality detection circuit 38. The register 36 temporarily stores the value of the digital signal output from the arithmetic-adder circuit 35.

The storage circuit 37 stores the threshold signal err_code representing the abnormal level of the drive current Iop as a digital signal that is the criterion for determining the degradation of the semiconductor laser. The abnormality detection circuit 38 generates the abnormality detection signal err indicating an abnormal state in which the digital value stored in the register 36 exceeds the digital value stored in the storage circuit 37.

More specifically, the semiconductor laser drive device 7c according to the embodiments includes an A/D conversion unit and an abnormality determination unit therein. Accordingly, it is not necessary to include the A/D conversion unit and the abnormality determination unit in the image controller 6. Consequently, it is possible to avoid complication, expansion and cost increase of the image controller 6. Further, the current value with the normal laser and the current with the degraded laser can be compared relatively so that the laser degradation detection can be performed with a higher degree of accuracy.

Thus, the semiconductor laser drive device 7c according to the third embodiment of can perform the degradation detection of the semiconductor laser with a high degree of accuracy, without complication, expansion and cost increase of the image controller 6.

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2010-172471 filed on Jul. 30, 2010 in the Japanese Patent Office, the entire contents of which are hereby incorporated by reference herein.

What is claimed is:
1. A semiconductor laser drive device, comprising:
a semiconductor-laser drive element to generate a drive current according to an input control signal to supply the drive current to a semiconductor laser;

a control circuit to control the drive current by controlling the semiconductor-laser drive element; and a drive current detection circuit to detect a current value of the drive current supplied to the semiconductor laser and generate a digital control signal representing the detected digital value of the drive current to output, wherein the drive current detection circuit comprises:

a proportional current generator to generate a current proportional to the drive current for output as a monitor current; and a D/A converter to generate a current according to the input digital value of the digital control signal for output as a detection current, wherein the drive current detection circuit generates a drive-current detection signal indicating detection of the drive current for output when a predetermined relation between the value of the detection current and the value of the monitor current is established, and wherein the drive current detection circuit comprises a counter that increases or decreases the digital value of the digital control signal input to the D/A converter according to a clock signal to increase or decrease the value of the detection current output from the D/A converter.

2. The semiconductor laser drive device according to claim 1, wherein the drive current detection circuit further comprises:

an oscillator to generate the clock signal; and a comparator to compare a value corresponding to the monitor current and a value corresponding to the detection current and output the drive current detection signal when a predetermined relation between the value of the detection current and the value of the monitor current is established.

3. The semiconductor laser drive device of claim 1, wherein, when the drive current detection signal is output, the drive current detection circuit detects the current value of the drive current by stopping the clock signal input to the counter and holding the value of the digital control signal input to the D/A converter and outputs the digital control signal representing the detected drive current.

4. The semiconductor laser drive device of claim 3, further comprising:

a storage circuit to store the digital control signal representing the current value of the drive current at a predetermined timing and output it at a given timing according to an external signal, wherein the predetermined timing is a time when the drive current detection signal is output.

* * * * *